United States Patent
Shimizu et al.

(10) Patent No.: US 10,342,143 B2
(45) Date of Patent: Jul. 2, 2019

(54) PRODUCTION METHOD FOR PRINTED WIRING BOARD HAVING DIELECTRIC LAYER

(71) Applicant: Mitsui Mining & Smelting Co., Ltd., Tokyo (JP)

(72) Inventors: Toshiyuki Shimizu, Saitama (JP); Toshifumi Matsushima, Saitama (JP); Yoshihiro Yoneda, Saitama (JP)

(73) Assignee: MITSUI MINNG & SMELTING CO., LTD., Tokyo (JP)

( * ) Notice: Subject to any disclaimer, the term of this patent is extended or adjusted under 35 U.S.C. 154(b) by 0 days.

(21) Appl. No.: 15/773,373

(22) PCT Filed: Nov. 18, 2016

(86) PCT No.: PCT/JP2016/084204
§ 371 (c)(1),
(2) Date: May 3, 2018

(87) PCT Pub. No.: WO2017/086418
PCT Pub. Date: May 26, 2017

(65) Prior Publication Data
US 2018/0332721 A1    Nov. 15, 2018

(30) Foreign Application Priority Data
Nov. 19, 2015    (WO) ................. PCT/JP2015/082627

(51) Int. Cl.
*H05K 1/18*       (2006.01)
*H05K 3/00*       (2006.01)
(Continued)

(52) U.S. Cl.
CPC .......... *H05K 3/4652* (2013.01); *B32B 15/08* (2013.01); *B32B 37/26* (2013.01); *H05K 1/0298* (2013.01);
(Continued)

(58) Field of Classification Search
CPC ............................... H05K 1/187; H05K 3/007
See application file for complete search history.

(56) References Cited

U.S. PATENT DOCUMENTS

2003/0168255 A1    9/2003  Kim et al.
2004/0147658 A1    7/2004  Matsushima et al.
(Continued)

FOREIGN PATENT DOCUMENTS

JP    2001-308548    11/2001
JP    2003-292733    10/2003
(Continued)

OTHER PUBLICATIONS

International Search Report, PCT/JP2016/084204, dated Feb. 7, 2017.

*Primary Examiner* — Jeremy C Norris
(74) *Attorney, Agent, or Firm* — Young & Thompson

(57) ABSTRACT

A production method includes: preparing a metal clad laminate including a dielectric layer≤30 μm thick, a first metal foil on a first surface of the dielectric layer, a second metal foil on a second surface of the dielectric layer, first and second carriers on the metal foil via a releasable layer; arranging the pair of metal clad laminates on a resin substrate so the first carrier of each metal clad laminate faces the resin substrate on each surface of the resin substrate; releasing the second carrier from a laminated member to expose the second metal foil; forming a pattern on the second metal foil; arranging an insulating layer on the pattern and arranging a metal layer on the insulating layer; and separating the first carrier and the first metal foil from each other. The dielectric layer has a strain energy at break of 1.8 MJ or less.

20 Claims, 5 Drawing Sheets

(51) Int. Cl.
*H05K 3/46* (2006.01)
*B32B 15/08* (2006.01)
*B32B 37/26* (2006.01)
*H05K 1/02* (2006.01)
*H05K 1/16* (2006.01)

(52) U.S. Cl.
CPC ........... *H05K 1/162* (2013.01); *H05K 3/4623* (2013.01); *H05K 3/4682* (2013.01); *H05K 2201/0154* (2013.01); *H05K 2201/0158* (2013.01); *H05K 2201/0187* (2013.01); *H05K 2201/0209* (2013.01); *H05K 2201/0355* (2013.01); *H05K 2203/0156* (2013.01)

(56) References Cited

U.S. PATENT DOCUMENTS

| | | |
|---|---|---|
| 2006/0203456 A1 | 9/2006 | Sohn et al. |
| 2007/0190237 A1 | 8/2007 | Kyozuka |

FOREIGN PATENT DOCUMENTS

| | | |
|---|---|---|
| JP | 2006-253656 | 9/2006 |
| JP | 2007-214427 | 8/2007 |

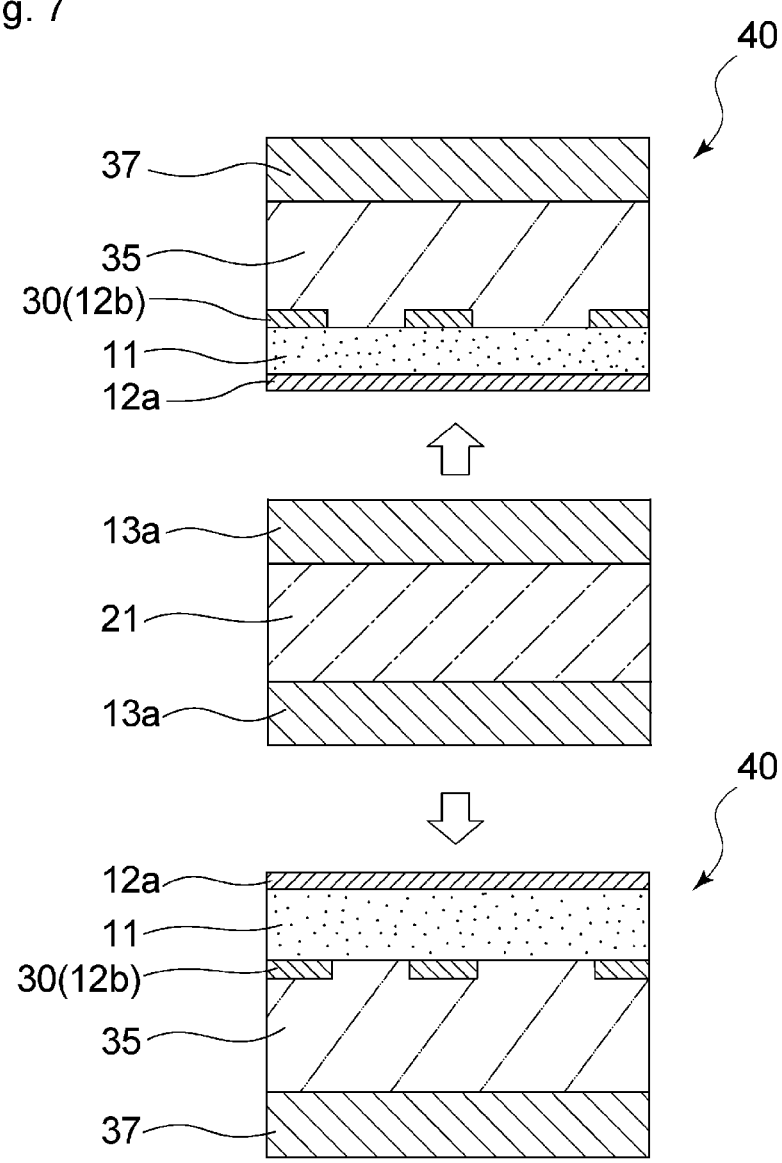

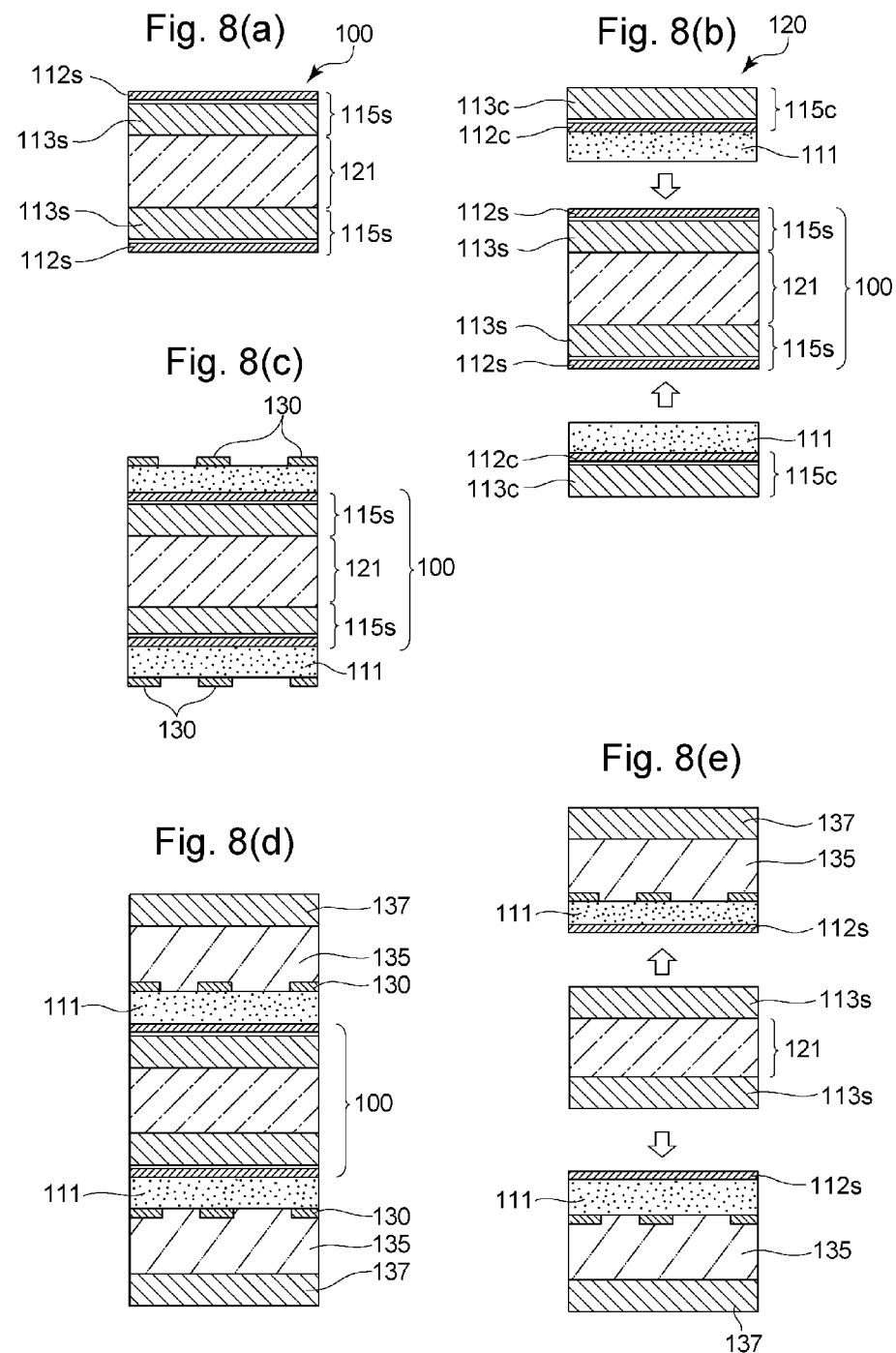

PRODUCTION METHOD FOR PRINTED WIRING BOARD HAVING DIELECTRIC LAYER

TECHNICAL FIELD

The present invention relates to a method for producing a dielectric layer-equipped printed wiring board.

BACKGROUND ART

A technique is known in which, using a method similar to the method for forming a circuit shape by using a copper clad laminate, a capacitor structure is formed in a printed wiring board, in particular, an inner layer portion of a multilayer printed wiring board, and the capacitor structure is used as an embedded capacitor. By forming the capacitor structure in the inner layer portion of the multilayer printed wiring board, it is possible to omit a capacitor provided on an outer layer surface, and achieve an outer layer circuit with a finer structure and higher density. As a result, the number of surface mounted components is reduced, which makes it easy to produce a printed wiring board including a fine pitch circuit.

The multilayer printed wiring board with an embedded capacitor described above is produced by, as disclosed in, for example, Patent Literature 1, using a double-sided copper clad laminate composed of a pair of copper foil layers and a dielectric layer provided between the copper foil layers, and etching the copper foil layer on each side into a capacitor electrode that has a desired shape. However, with the double-sided copper clad laminate disclosed in Patent Literature 1, the dielectric layer is brittle. Accordingly, the dielectric layer may be damaged if an excessively high external force is applied during the production process.

The method as shown in FIGS. 8(a) to 8(f) is known as an example of a method for producing a multilayer printed wiring board that addresses the problem described above. According to the method shown in FIGS. 8(a) to 8(f), first, as shown in FIG. 8(a), a carrier attached copper foil 115s is arranged on each surface of a resin substrate 121 to obtain a support member 100. The carrier attached copper foils 115s are arranged on the resin substrate 121 in such a manner that a carrier 113s of each carrier attached copper foil 115s faces the resin substrate 121.

Next, as shown in FIG. 8(b), a dielectric-carrier attached copper foil is arranged on each surface of the support member 100 in this state, each dielectric-carrier attached copper foil being a laminate of a carrier attached copper foil 115c and a dielectric layer 111. Each carrier attached copper foil 115c is arranged on the support member 100 in such a manner that the dielectric layer 111 faces a copper foil 112s included in the support member 100. In this way, a laminated member 120 is obtained. The dielectric layers 111 before being stacked contain a thermosetting resin in the B stage.

In each of the obtained laminated members 120, as shown in FIG. 8(c), a carrier 113c included in the carrier attached copper foil 115c is released so as to expose the copper foil 112s to the surface, and the exposed copper foil 112 is etched. By doing so, a conductor pattern 130 is formed as shown in FIG. 8(c). Next, as shown in FIG. 8(d), an insulating layer 135 is arranged on each of the conductor patterns 130, and a copper layer 137 is arranged on each of the insulating layers 135. Then, as shown in FIG. 8(e), separation is performed between the carriers 113c and copper foils 112s in the support member 100.

CITATION LIST

Patent Literature

Patent Literature 1: JP 2003-292733A

SUMMARY OF INVENTION

According to the method shown in FIGS. 8(a) to 8(e), it is possible to produce a dielectric layer-equipped printed wiring board in which damage to the dielectric layers 111 is suppressed to some degree. However, with this method, the thermosetting resin contained in each dielectric layer 111 is in the B stage when the dielectric layers 111 are arranged on the support member 100, and thus variations in the thickness of the dielectric layers 111 are likely to occur due to variations in the thickness of the support member 100 (including an undulating shape on a surface). Because the capacitance of a capacitor depends on the thickness of the dielectric layer, a variation in the thickness of the dielectric layer 111 causes a variation in the capacitance of the resulting capacitor, which increases the difference between the designed capacitance value and the actual capacitance value. Also, if the dielectric layer 111 is a thin and brittle layer with a low strain energy at break, due to the magnitude of the undulation of the support member 100, the dielectric may be bent when stacked, thus inevitably causing damage to the dielectric layer.

Accordingly, it is an object of the present invention to improve upon the method for producing a dielectric layer-equipped printed wiring board. To be more specific, an object of the present invention is to provide a method for producing a printed wiring board, wherein damage to the dielectric layer is minimized and variation in the thickness is unlikely to occur even when a dielectric layer 111 itself is highly brittle.

The present invention provides a method for producing a printed wiring board which includes a dielectric layer having a thickness of 30 μm or less, the method including:
preparing a metal clad laminate comprising: a dielectric layer; a first metal foil arranged on a first surface of the dielectric layer; a second metal foil arranged on a second surface of the dielectric layer; a first carrier arranged on the first metal foil via a releasable layer; and a second carrier arranged on the second metal foil via a releasable layer;
forming, using the pair of metal clad laminates, a laminated member by arranging the metal clad laminates on both surfaces of a resin substrate, respectively, in such a manner that the first carrier of each metal clad laminate faces the resin substrate;
releasing the second carrier from the laminated member so as to expose the second metal foil;
etching the exposed second metal foil to form a conductor pattern;
arranging an insulating layer on the conductor pattern and arranging a metal layer onto the insulating layer; and then
separating the first carrier and the first metal foil from each other in the laminated member,
wherein the dielectric layer has a strain energy at break of 1.8 MJ or less.

The present invention also provides a laminated member including: a resin substrate; and a pair of metal clad laminates, the metal clad laminate including: a dielectric layer having a thickness of 30 μm or less and a strain energy at break of 1.8 MJ or less; a first metal foil arranged on a first surface of the dielectric layer; a second metal foil arranged on a second surface of the dielectric layer; a first carrier arranged on the first metal foil via a releasable layer; and a second carrier arranged on the first metal foil via a releasable layer, the pair of metal clad laminates being arranged on the resin substrate in such a manner that the first carrier of each metal clad laminate faces each surface of the resin substrate.

BRIEF DESCRIPTION OF DRAWINGS

FIG. 7 is a diagram schematically showing the laminated member in a state in which a first metal foil and a first carrier are separated from each other in the laminated member shown in FIG. 6.

FIGS. 8(a) to 8(e) are schematic diagrams sequentially showing a process of producing a capacitor-embedded printed wiring board according to a conventional technique.

DESCRIPTION OF EMBODIMENTS

Hereinafter, the present invention will be described by way of a preferred embodiment of the present invention with reference to the drawings. The production method according to the present invention can be roughly divided into the following first to sixth steps. Each step will be described in detail below.

First Step

Prepared is a metal clad laminate which includes a dielectric layer; a first metal foil arranged on a first surface of the dielectric layer; a second metal foil arranged on a second surface of the dielectric layer; a first carrier arranged on the first metal foil via a releasable layer; and a second carrier arranged on the second metal foil via a releasable layer.

Second Step

A laminated member is formed, with the use of the pair of metal clad laminates, by arranging the metal clad laminates on both surfaces of a resin substrate, respectively, in such a manner that the first carrier of each metal clad laminate faces the resin substrate.

Third Step

The second carrier is released from the laminated member so as to expose the second metal foil.

Fourth Step

The second metal foil is etched to form a conductor pattern.

Fifth Step

An insulating layer is arranged on the conductor pattern, and a metal layer is arranged on the insulating layer.

Sixth Step

In the laminated member, the first carrier and the first metal foil are separated from each other.

First Step

Figure 1:
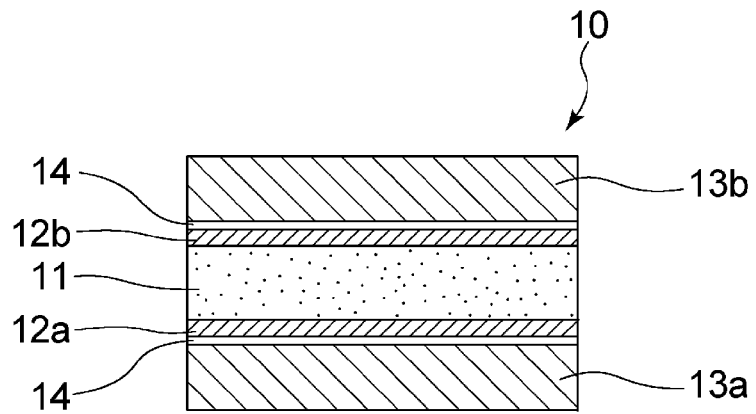
FIG. 1 is a diagram schematically showing a cross sectional structure of a metal clad laminate used in a production method according to the present invention.

In the first step, a metal clad laminate 10 shown in FIG. 1 is prepared. The metal clad laminate 10 includes a dielectric layer 11. A first metal foil 12a is arranged on one of two surfaces of the dielectric layer 11. A second metal foil 12b is arranged on the other surface of the dielectric layer 11. A first carrier 13a is arranged on one of the surfaces of the first metal foil 12a that does not face the dielectric layer 11. On the other hand, a second carrier 13b is arranged on one of the surfaces of the second metal foil 12b that does not face the dielectric layer 11. A releasable layer 14 is provided between the first metal foil 12a and the first carrier 13a. Likewise, another releasable layer 14 is also provided between the second metal foil 12b and the second carrier 13b.

The electric capacity and power storage of the dielectric layer 11 increases the thinner it is. The stored electric power is used in power supply, contributing to power saving. The thickness of the dielectric layer 11 is determined at the design stage of the product and circuit. In the present invention, taking into consideration the level required by the market, the thickness of the dielectric layer 11 is 30 μm or less, preferably 16 μm or less, more preferably 12 μm or less, even more preferably 10 μm or less, and particularly preferably 5 μm or less. There is no lower limit in the thickness of the dielectric layer 11 as long as the dielectric layer 11 has a thickness that does not cause a short circuit between the first metal foil 12a and the second metal foil 12b. The thickness is preferably 0.1 μm or more, for example. In order to more reliably prevent the short circuit described above, the thickness is more preferably 0.5 μm or more.

The dielectric layer 11 preferably has, on condition that the dielectric layer 11 has a thickness within the above-described range, little thickness variation when measured at a plurality of arbitrarily selected positions. The reason is that, when there is little thickness variation, variation in the capacitance of the capacitor formed from the dielectric layer 11 is unlikely to occur. From this viewpoint, the dielectric layer 11 preferably has a thickness variation of ±15% or less, more preferably ±10% or less, and even more preferably ±8% or less. The thickness variation of the dielectric layer 11 refers to a value defined by a greater one of numerical values (unit: %) represented by the following expressions (1) and (2) that are obtained by obtaining a maximum value, a minimum value, and an average value through measuring thickness at a total of at least ten locations in an enlarged cross section (for example, enlarged by a magnification of 500 or more) in the thickness direction of the center and end portions (for example, four corners in the case where the dielectric layer 11 is rectangular) of the dielectric layer 11:

$$[100\times(\text{maximum value}-\text{average value})/\text{average value}] \quad (1); \text{ and}$$

$$[100\times(\text{average value}-\text{minimum value})/\text{average value}] \quad (2).$$

In order to reduce the thickness variation of the dielectric layer 11, the dielectric layer 11 may be formed by using a method described below, for example.

The dielectric layer 11 contains any type of insulating resin including a thermosetting resin. As used herein, the term "thermosetting resin" refers to a resin after curing (cross-linking), and thus does not mean a thermosetting resin in the A stage or B stage. In the case where the insulating resin is a thermosetting resin, those conventionally used in the technical field of printed wiring boards can be used as the thermosetting resin. Examples of the thermosetting resin include an epoxy resin, a polyimide resin, a polyamide resin, a polyphenylene ether resin, a cyanate resin, a bismaleimide resin, a phenol resin, a phenoxy resin, a styrene-butadiene resin, and the like.

The dielectric layer 11 is required to increase the capacitance of the capacitor while serving as an insulating layer and ensuring heat resistance and insulating properties. For this purpose, the dielectric layer 11 preferably contains a material (dielectric particles in particular) that increases the relative dielectric constant, or has a small thickness. As a result, the value of the strain energy at break of the dielectric layer 11 will be relatively lower than the value of the strain energy at break that is inherent in the thermosetting resin described above.

In a preferred embodiment, the dielectric layer 11 does not contain a fibrous material, such as a glass woven fabric, a glass non-woven fabric and paper, or a film-shaped material made of, for example, a polyimide resin or the like, or in other words, a reinforcing material for reinforcing the dielectric layer 11. The reinforcing material is a material useful for imparting strength to the dielectric layer 11. However, the use of a reinforcing material is disadvantageous in that the thickness of the dielectric layer 11 increases.

The present invention aims to give priority to achieving a reduction in the thickness of the printed wiring board and an increase in the capacity of the embedded capacitor, rather than improving the strength of the dielectric layer 11. For this reason, the dielectric layer 11 contains no reinforcing material. Problems caused by an increase in the brittleness of the dielectric layer 11 and a reduction in the strength of the dielectric layer 11 can be overcome by using the production method according to the present invention.

The dielectric layer 11 preferably has a relative dielectric constant of 10 or more, more preferably 20 or more, and even more preferably 40 or more. By setting the relative dielectric constant of the dielectric layer 11 to be greater than or equal to the above values, the capacitance can be easily increased while reducing the thickness of the dielectric layer 11. The higher the relative dielectric constant, the more preferable the dielectric layer 11. However, taking into consideration adhesion to metal foils, and strength of the dielectric layer, the relative dielectric constant is preferably 300 or less, more preferably 200 or less, and even more preferably 100 or less. As used herein, the term "relative dielectric constant" refers to a value measured using a split-post dielectric resonance method (used frequency: 1 GHz).

As a means for causing the dielectric layer 11 to satisfy the above-described relative dielectric constant, the dielectric layer 11 preferably contains dielectric particles. The dielectric particles are preferably made of a material having a relative dielectric constant of 50 or more and 20000 or less. For example, it is possible to use a composite oxide with a perovskite structure such as a barium titanate-based ceramic, a calcium titanate-based ceramic, a magnesium titanate-based ceramic, a bismuth titanate-based ceramic, a strontium titanate-based ceramic, a lead zirconate-based ceramic, a barium zirconate-based ceramic, or a calcium zirconate-based ceramic. Out of these composite oxides with a perovskite structure, if a high dielectric constant is to be obtained, it is preferable to use at least one of a barium titanate-based ceramic or a strontium titanate-based ceramic.

The dielectric particles preferably have a particle size of 0.01 μm or more and 1.0 μm or less from the viewpoint of keeping the dielectric constant of the dielectric layer 11 at a constant level irrespective of location. As used herein, the term "particle size" refers to a volume cumulative particle size $D_{50}$ at a cumulative volume of 50 capacity % measured using a laser diffraction scattering particle size distribution measurement method.

From the viewpoint of balancing the improvement in the capacitance and the strength of the dielectric layer 11, the proportion of dielectric particles in the dielectric layer 11 is preferably 60 mass % or more and 95 mass % or less, and more preferably 70 mass % or more and 90 mass % or less. The proportion of dielectric particles in the dielectric layer 11 can be obtained by subliming the resin component in the dielectric layer and measuring the mass of the remaining particles.

The dielectric layer 11 that contains no reinforcing material and that is filled with dielectric particles at a high concentration as described above is very brittle. For this reason, if stress during arranging is high, the dielectric layer 11 may not be able to withstand the stress and may break. However, with the production method according to the present invention, the dielectric layer 11 can be arranging without the dielectric layer 11 being damaged.

The property value that indicates brittleness can be appropriately indicated by strain energy at break. In a stress σ-strain ε curve in a tensile test of a resin film for forming the dielectric layer 11, strain energy at break U (unit: MJ (mega joule)) is calculated using the following integral equation. Here, $\varepsilon_b$ represents the strain at break.

$$U=\int_0^{\varepsilon_b}\sigma\varepsilon\,d\varepsilon \quad [\text{Math. 1}]$$

When the dielectric layer 11 filled with dielectric particles at a high concentration has a strain energy at break of 1.8 MJ or less, the effect of suppressing damage to the dielectric layer 11 and the effect of suppressing thickness variation that are the effects of the production method according to the present invention are sufficiently exhibited. The strain energy at break is typically 1.2 MJ or less, more typically 0.8 MJ or less, and even more typically 0.5 MJ or less. There is no lower limit in the strain energy at break U. However, the effects of the present invention are sufficiently exhibited when the strain energy at break is 0.01 MJ or more, and more preferably 0.02 MJ or more.

The dielectric layer 11 that has a low strain energy at break tends to have low tensile strength. A dielectric layer 11 that typically has a high relative dielectric constant typically has a tensile strength of 60.0 MPa or less, more typically 55.0 MPa or less, and particularly 50.0 MPa or less. In this case, the effects of the present invention function more advantageously.

On the other hand, from the viewpoint of ensuring sufficient adhesion between the dielectric layer 11 and the metal foil 12a and between the dielectric layer 11 and the metal foil 12b, the dielectric layer 11 preferably has a tensile strength of 5.0 MPa or more, and more preferably 8.0 MPa or more.

Also, when the dielectric layer 11 has a tensile elongation at break (strain at break) as low as 5.0% or less, 4.0% or less, or in particular 1.0% or less, the effects of the present invention function more advantageously.

On the other hand, from the viewpoint of retaining flexibility sufficient to at least withstand handling during production of the printed wiring board, the dielectric layer 11 preferably has a tensile elongation at break (strain at break) of 0.05% or more, and more preferably 0.2% or more.

With respect to the strain energy at break, the tensile strength, and the tensile elongation at break described above, values obtained from a stress strain curve measured in accordance with JIS K7161 (1994) "Plastic-Tensile Characteristics Testing Method" at a measurement temperature of 25° C., a gauge length of 50 mm, and a tensile speed of 1.0 mm/min (2%/min in terms of strain speed) are used as standard conditions. If a sample of the dielectric layer 11 is too short to ensure the above gauge length, measurement may be performed by using a method in which the strain speed is set to 2%/min.

Another property value that indicates brittleness of the dielectric layer 11 is an indentation elastic modulus Eit. The dielectric layer 11 typically has an indentation elastic modulus Eit of typically 4800 N/mm$^2$ or more, more typically 6000 N/mm$^2$ or more, and particularly 8000 N/mm$^2$ or more. As the indentation elastic modulus Eit, a value measured using a nanoindentation method in accordance with ISO 14577 (2015) is used.

There is no particular limitation on the thickness of the first metal foil 12a and the second metal foil 12b that are provided adjacent to the dielectric layer 11, and the first metal foil 12a and the second metal foil 12b may be thin or may be thick. The thickness of the metal foils 12a and 12b is preferably set to, for example, 0.1 μm or more and 70 μm or less. The metal foils 12a and 12b may be any one of rolled foils, electrolytic foils, and vapor deposition foils. The metal foils 12a and 12b may be metal foils of the same thickness and/or the same type, or may be metal foils of different thicknesses and/or different types. The metal foils 12a and 12b are typically, for example, copper foils, but may be metal foils other than copper foils.

From the viewpoint of increasing the capacitance to a sufficiently high level while ensuring a sufficient thickness of the dielectric layer 11, one of the surfaces of the first metal foil 12a and the second metal foil 12b that faces the dielectric layer 11 preferably has low roughness. From this viewpoint, the surface of the first metal foil 12a and the second metal foil 12b that face the dielectric layer 11 has a surface roughness Rz of preferably 1.5 μm or less, more preferably 1.0 μm or less, the surface roughness being ten point average roughness Rz (JIS B0601-1994). It is more preferable that the surface is not subjected to a roughening process. In doing so, the thickness of the dielectric layer 11 can be easily made uniform.

The first carrier 13a and the second carrier 13b are mainly used as support members for supporting the metal foils 12a and 12b so as to improve the ease of handling of the first metal foil 12a and the second metal foil 12b. There is no particular limitation on the material for forming the carriers 13a and 13b, but it is possible to use, for example, a resin film such as a polyethylene terephthalate film, a polyethylene naphthalate film, an aramid film, a polyimide film, a polyamide film, or a liquid crystal polymer film; a copper foil, a copper alloy foil, an aluminum foil, a composite metal foil obtained by providing a metal plating layer made of copper or zinc on a surface of an aluminum foil, a stainless foil, or the like. The carriers 13a and 13b may be carriers of the same thickness and/or the same material, or may be carriers of different thicknesses and/or different materials. Among them, from the viewpoint of retaining stability of releasing strength between the carriers 13a and 13b and the metal foils 12a and 12b as well as the rigidity of the carriers 13a and 13b, the carriers 13a and 13b are preferably made of copper foils or copper alloy foils, and more preferably copper foils. Also, the thickness of the carriers 13a and 13b may be set independently of the thickness of the metal foils 12a and 12b. Ordinarily, the carriers 13a and 13b are formed to be thicker than the metal foils 12a and 12b, but in the case where the carriers 13a and 13b are made of metal, the carriers 13a and 13b may be formed to be thinner than the metal foils 12a and 12b as necessary.

The releasable layer 14 provided between the first metal foil 12a and the first carrier 13a and the releasable layer 14 provided between the second metal foil 12b and the second carrier 13b are used to improve the releasability between the metal foils 12a and 12b and the carriers 13a and 13b. As the releasable layers 14, those conventionally used in the technical field of carrier attached metal foils can be used without any particular limitation. The releasable layers 14 may be either organic releasable layers or inorganic releasable layers. Examples of organic components used in the organic releasable layers include a nitrogen-containing organic compound, a sulfur-containing organic compound, carboxylic acid, and the like. On the other hand, examples of inorganic components used in the inorganic releasable layers include Ni, Mo, Co, Cr, C, Al, Fe, Ti, W, P, Zn, a chromated film, and the like.

Figure 2A:
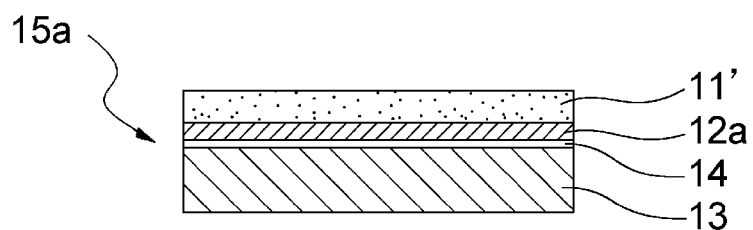
FIGS. 2(a) and 2(b) are schematic diagrams sequentially showing a process of producing the metal clad laminate shown in FIG. 1.

The metal clad laminate 10 shown in FIG. 1 can be produced by using, for example, a method described below. Specifically, as shown in FIG. 2(a), a resin solution containing dielectric particles is applied to a surface of a first metal foil 12a of a carrier attached metal foil 15a that has been produced in advance. The resin solution contains, for example, dielectric particles, a non-cured thermosetting resin, a curing agent, an organic solvent, and the like. By drying a coating film formed by applying the resin solution, a dielectric layer 11' in a semi-cured state, or in other words, in the B stage is formed. The drying method may be simply drying using air or heat, or may be drying using a combination of air and heat. The drying atmosphere such as atmospheric air drying or reduced pressure drying may be suitably selected according to the step.

Figure 2B:
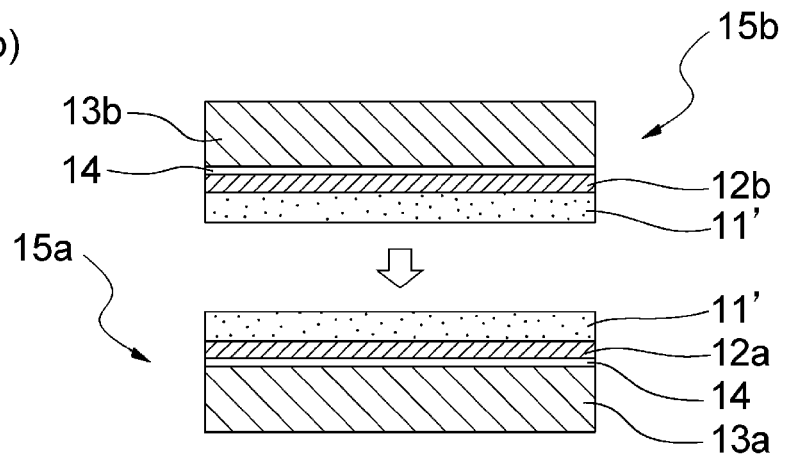

Next, as shown in FIG. 2(b), the carrier attached metal foil 15a on which the dielectric layer 11' in the B stage has been formed and another carrier attached metal foil 15b on which the dielectric layer 11' has been formed are stacked one onto the other. The carrier attached metal foil 15b has the same layer configuration as that of the carrier attached metal foil 15a. The carrier attached metal foil 15b may be exactly the same as the carrier attached metal foil 15a. Alternatively, the thickness of each layer may be different as long as the layer configuration is the same. As shown in the diagram, the carrier attached metal foil 15a and the carrier attached metal foil 15b are stacked in such a manner that the dielectric layer 11' of the carrier attached metal foil 15a and the dielectric layer 11' of the carrier attached metal foil 15b face each other. In this case, it is preferable that the second metal foil 12b of the carrier attached metal foil 15b has low roughness. The reason for this is the same as why the roughness of the first metal foil 12a is set to be low. After the two carrier attached metal foils 15a and 15b have been stacked, they are pressed under heat, and the dielectric layers 11' are thereby cured, as a result of which the two carrier attached metal foils 15a and 15b are bonded together. In doing so, a metal clad laminate 10 shown in FIG. 1 is obtained.

In the production of the metal clad laminate 10, instead of the arranging method described above, the carrier attached metal foil 15a on which the dielectric layer 11' in the B stage has been formed and another separately prepared carrier attached metal foil 15b (specifically, a carrier attached metal foil in which a carrier 13b are arranged on a metal foil 12b via a releasable layer 14) may be stacked one onto the other. In this case, the two metal foils are stacked in such a manner that the dielectric layer 11' of the carrier attached metal foil 15a and the metal foil 12b of the carrier attached metal foil 15b face each other.

Second Step

Figure 3:
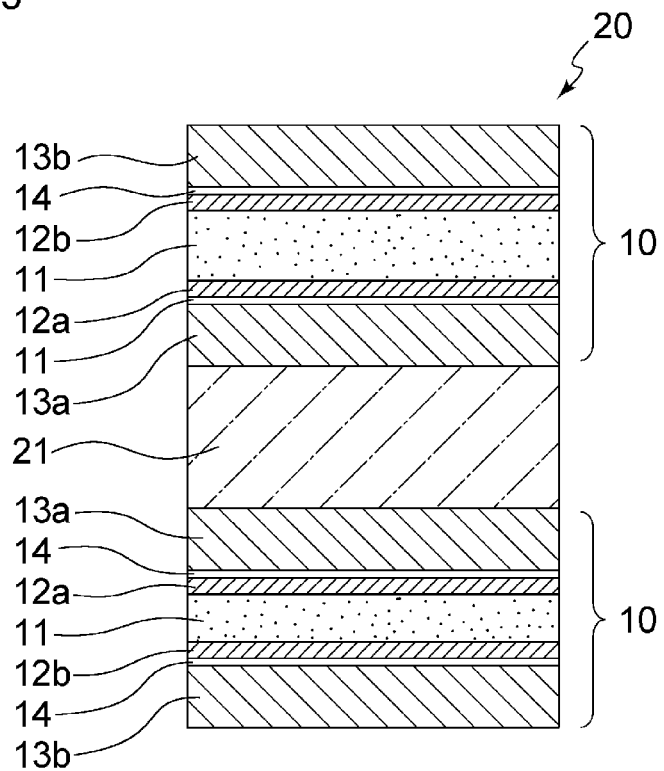
FIG. 3 is a diagram schematically showing a cross sectional structure of a laminated member formed by using the metal clad laminate shown in FIG. 1.

In this step, as shown in FIG. 3, a laminated member 20 is formed by arranging metal clad laminates 10, which were prepared in the first step, and a resin substrate 21. The resin substrate 21 may be an insulating resin substrate composed of a required number of laminated prepregs or the like obtained by, for example, impregnating a fibrous material such as glass woven fabric, glass non-woven fabric, or paper with an insulative resin (an epoxy resin, a cyanate resin, a bismaleimide triazine resin, a polyphenylene ether resin, a phenol resin, a polyimide resin, or the like). Alternatively, an insulating resin layer made of an insulating resin such as an epoxy resin, a polyimide resin, or a polyester resin may be used as the resin substrate. In either case, the resin substrate 21 is preferably in the B stage. There is no particular limitation on the thickness of the resin substrate, but ordinarily, the resin substrate has a thickness of preferably 10 μm or more and 1000 μm or less, and more preferably 20 μm or more and 400 μm or less.

As shown in FIG. 3, each of the metal clad laminates 10 prepared in the first step is disposed on each surface of the resin substrate 21, respectively. That is, a pair of metal clad laminates 10 are used. Then, the metal clad laminates 10 are arranged on the resin substrate 21 in such a manner that one of the carriers of each metal clad laminate 10 faces one side of the resin substrate 21. Subsequently, they are pressed under heat, and the resin substrate 21 in the B stage is thereby cured, as a result of which the resin substrate 21 and the pair of metal clad laminates 10 are bonded together. As a result of the bonding, a laminated member 20 is obtained. Accordingly, the laminated member 20 is a laminated member including a resin substrate 21 and metal clad laminates 10 in each of which a first metal foil 12a is arranged on one surface of a dielectric layer 11, a second metal foil 12b is arranged on the other surface of the dielectric layer 11, and a first carrier 13a and a second carrier 13b are respectively arranged on the first metal foil 12a and the second metal foil 12b via a releasable layer 14, wherein each metal clad laminate 10 and the resin substrate 21 are arranged in such a manner that the first carrier 13a of the metal clad laminate 10 faces the resin substrate 21. To be more specific, the metal clad laminates 10 and 10 are arranged on the resin substrate 21 in such a manner that the first carriers 13a and 13a of the metal clad laminates 10 and 10 faces the resin substrate 21 on each surface of the resin substrate 21.

Each of the metal clad laminates 10 is a metal clad laminate produced by attaching a metal foil directly onto a resin solution that has been applied, and thus the dielectric layer 11 has little thickness variation. In addition, the dielectric layer 11 of each metal clad laminate 10 has already been cured, and therefore the likelihood of thickness variation occurring in the dielectric layer 11 is very low. Accordingly, when a printed wiring board is produced by using the metal clad laminates 10 including the dielectric layers 11 described above, in a capacitor embedded in the printed wiring board, variation is unlikely to occur in the capacitance. Moreover, the dielectric layer 11 does not contain a reinforcing material, such as a fibrous material or a film-shaped material, that is a material that may increase the thickness of the dielectric layer 11. Thus, the dielectric layer 11 is not affected by a thickness constraint due to the presence of the reinforcing material. As a result, the capacitance of the capacitor can be easily increased. In contrast, with the technique shown in FIG. 8 explained in Background Art, the dielectric layer 111 is affected by the thickness variation of the resin substrate 121.

Third Step and Fourth Step

Figure 4:
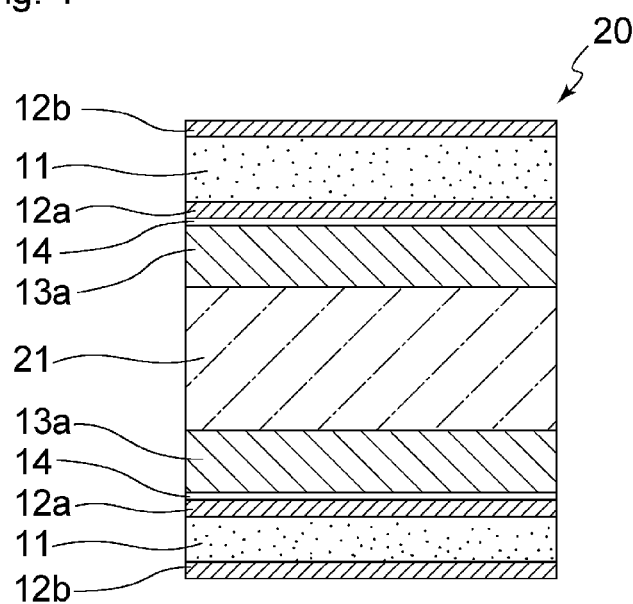
FIG. 4 is a diagram schematically showing a cross sectional structure of the laminated member in a state in which second carriers have been released from the laminated member shown in FIG. 3.
Figure 5:
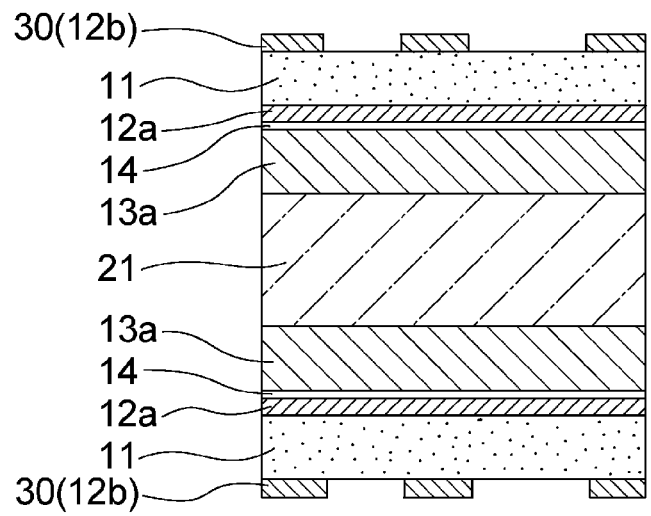
FIG. 5 is a diagram schematically showing a cross sectional structure of the laminated member in a state in which conductor patterns have been formed in the laminated member structure shown in FIG. 4.

In this step, as shown in FIG. 4, the second carriers 13b and 13b are released from the laminated member 20 so as to expose the second metal foils 12b and 12b (third step). Subsequently, as shown in FIG. 5, a conductor pattern 30 is formed by etching each of the exposed second metal foils 12b and 12b (fourth step). The conductor pattern 30 may serve as a counter electrode of the capacitor, or may serve as a signal line, a power supply line, or a ground line connected to the counter electrode. There is no particular limitation on the method for forming the conductor pattern 30, and it is possible to use, for example, a subtractive method that is conventionally used in the technical field of printed wiring boards. For example, the second metal foils 12b and 12b are surface-smoothed, and a dry film is attached to each metal foil so as to form an etching resist layer. On the etching resist layer, an electric circuit including a capacitor circuit is exposed and developed to form an etching pattern. After that, for example, circuit etching is performed by using an etching solution, and a conductor pattern is thereby formed. The dielectric layers 11 are supported by the resin substrate 21 and their first carriers 13a and 13a, and thus have good handleability in various steps performed to form a circuit. Also, even if shower pressure is applied during etching, breakage of the dielectric layer 11 is suppressed.

Fifth Step

Figure 6:
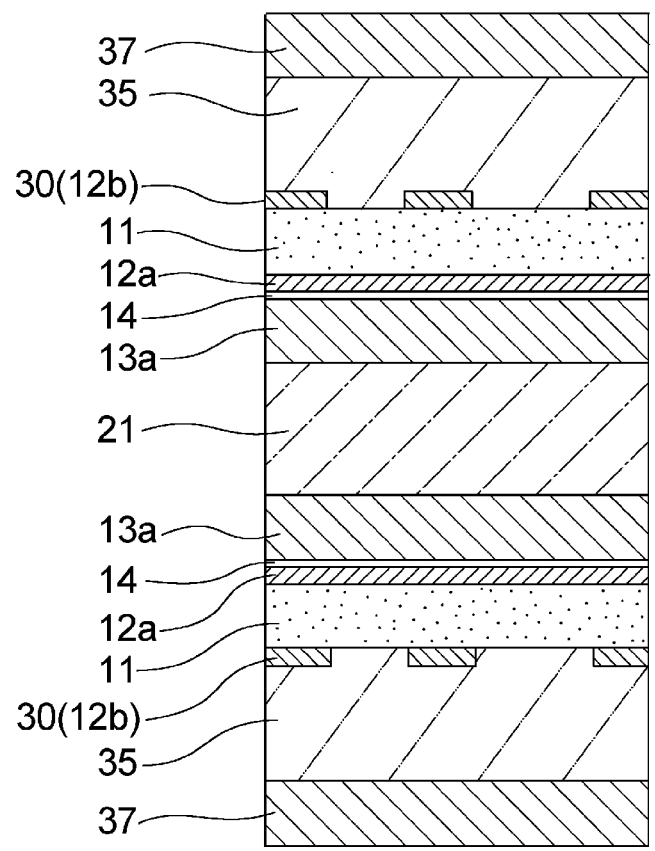
FIG. 6 is a diagram schematically showing a cross sectional structure of the laminated member in a state in which insulating layers and metal layers have been arranged on the laminated member shown in FIG. 5.

In this step, as shown in FIG. 6, insulating layers 35 and 35 and metal layers 37 and 37 are arranged on the exposed surfaces of the laminated member 20 including the conductor patterns 30 formed in the fourth step. There is no particular limitation on the method for arranging the insulating layer 35 on the metal layer 37. It is also possible to, for example, separately prepare an insulating layer 35 and a metal layer 37 such as a copper layer, and arranging the insulating layer 35 and the metal layer 37 on the exposed surface of one of the conductor patterns 30 of the laminated member 20. For example, as the insulating layer 35, a layer composed of the same material as that of the resin substrate 21 explained in the second step above is used. The insulating layer 35 is arranged on the conductor pattern 30, and a metal layer 37 is arranged on the insulating layer 35. The insulating layer 35 is preferably in a semi-cured state, or in other words, the B stage before being arranged on the laminated member 20. The insulating layer 35 in this state is arranged on the laminated member 20 together with the metal layer 37, which is then pressed under heat. The insulating layer 35 is thereby cured, and as a result, the laminated member 20, the insulating layer 35, and the metal layer 37 are bonded together to form a unitary body. Also, instead of separately preparing an insulating layer 35 and a metal layer 37, a laminate thereof may be replaced by a resin-attached metal foil. An appropriate value is selected as the thickness of the metal foil according to the specific application of the intended printed wiring board.

As the metal layer 37, any type of metal foil can be used including copper foil. It is possible to use, for example, a rolled foil, an electrolytic foil, a vapor deposition foil, or the like. In the case where the metal layer 37 is thin, the metal layer 37 may be formed by using a carrier attached metal foil, instead of using a metal foil alone.

Sixth Step

In this step, in the laminated member 20 in which the insulating layers 35 have been arranged on the metal layers 37 in the fifth step, the first metal foil 12a and the first carrier 13a are separated from each other as shown in FIG. 7. After that, circuit formation is performed using a known method, and a multilayer printed wiring board including the dielectric layer 11 is thereby obtained. The printed wiring board obtained in the above-described manner may be used as is, or may be subjected to an additional process such as arranging according to the specific application.

As described above, the production method according to the present invention is very advantageous as compared with, for example, the technique disclosed in Patent Literature 1, in that a defect such as a crack is unlikely to occur in the dielectric layer during the production process of the printed wiring board despite the fact that the dielectric layer 11 does not contain a reinforcing material. Also, the printed wiring board is produced using the already cured dielectric layer 11. Accordingly, the thickness of the dielectric layer 11 is unlikely to vary during the production process of the printed wiring board, and for this reason, variation in the capacitance of the capacitor embedded in the printed wiring board is unlikely to occur. Moreover, according to the production method according to the present invention, it is possible to produce a capacitor-embedded printed wiring board through a number of steps less than or equal to the number of steps required in the conventional method.

Although the present invention has been described above by way of a preferred embodiment thereof, the present invention is not limited to the embodiment given above.

INDUSTRIAL APPLICABILITY

As described in detail above, with the production method according to the present invention, variation in the capacitance of the capacitor embedded in the printed wiring board is unlikely to occur. Also, even if the dielectric layer 11 itself is highly brittle, it is possible to more effectively suppress a defect such as a crack in the dielectric layer. Furthermore, it is possible to produce a capacitor-embedded printed wiring board by using a number of steps less than or equal to the number of steps required in the conventional method.

The invention claimed is:

1. A laminated member comprising: a resin substrate; and a pair of metal clad laminates,
    the metal clad laminate comprising: a dielectric layer having a thickness of 30 μm or less and a strain energy at break of 1.8 MJ or less; a first metal foil arranged on a first surface of the dielectric layer; a second metal foil arranged on a second surface of the dielectric layer; a first carrier arranged on the first metal foil via a releasable layer; and a second carrier arranged on the first metal foil via a releasable layer,
    the pair of metal clad laminates being arranged on the resin substrate in such a manner that the first carrier of each metal clad laminate faces each surface of the resin substrate.

2. The laminated member according to claim 1, wherein the dielectric layer has a tensile strength of 60.0 MPa or less, and a tensile elongation at break of 5.0% or less.

3. The laminated member according to claim 1, wherein the dielectric layer has a thickness variation of ±15% or less.

4. The laminated member according to claim 1, wherein the dielectric layer has a relative dielectric constant of 10 or more.

5. The laminated member according to claim 1, wherein the dielectric layer contains dielectric particles in the dielectric layer.

6. The laminated member according to claim 1, wherein the dielectric layer contains dielectric particles in an amount of 60 mass % or more and 95% or less in the dielectric layer.

7. A method for producing a printed wiring board which includes a dielectric layer having a thickness of 30 μm or less,
    the method comprising:
        preparing a metal clad laminate comprising: a dielectric layer; a first metal foil arranged on a first surface of the dielectric layer; a second metal foil arranged on a second surface of the dielectric layer; a first carrier arranged on the first metal foil via a releasable layer; and a second carrier arranged on the second metal foil via a releasable layer;
        forming, using the pair of metal clad laminates, a laminated member by arranging the metal clad laminates on both surfaces of a resin substrate, respectively, in such a manner that the first carrier of each metal clad laminate faces the resin substrate;
        releasing the second carrier from the laminated member so as to expose the second metal foil;
        etching the exposed second metal foil to form a conductor pattern;
        arranging an insulating layer on the conductor pattern and arranging a metal layer onto the insulating layer; and then
        separating the first carrier and the first metal foil from each other in the laminated member,
    wherein the dielectric layer has a strain energy at break of 1.8 MJ or less.

8. The method for producing a printed wiring board according to claim 7, wherein the dielectric layer has a tensile strength of 60.0 MPa or less and a tensile elongation at break of 5.0% or less.

9. The method for producing a printed wiring board according to claim 8, wherein a dielectric layer that has a thickness variation of ±15% or less is used as the dielectric layer.

10. The method for producing a printed wiring board according to claim 8, wherein a dielectric layer that has a relative dielectric constant of 10 or more is used as the dielectric layer.

11. The method for producing a printed wiring board according to claim 8, wherein a dielectric layer containing dielectric particles therein is used as the dielectric layer.

12. The method for producing a printed wiring board according to claim 8, wherein a dielectric layer containing dielectric particles in an amount of 60 mass % or more and 95% or less therein is used as the dielectric layer.

13. The method for producing a printed wiring board according to claim 7, wherein a dielectric layer that has a thickness variation of ±15% or less is used as the dielectric layer.

14. The method for producing a printed wiring board according to claim 13, wherein a dielectric layer that has a relative dielectric constant of 10 or more is used as the dielectric layer.

15. The method for producing a printed wiring board according to claim 13, wherein a dielectric layer containing dielectric particles therein is used as the dielectric layer.

16. The method for producing a printed wiring board according to claim 13, wherein a dielectric layer containing dielectric particles in an amount of 60 mass % or more and 95% or less therein is used as the dielectric layer.

17. The method for producing a printed wiring board according to claim 7, wherein a dielectric layer that has a relative dielectric constant of 10 or more is used as the dielectric layer.

18. The method for producing a printed wiring board according to claim 17, wherein a dielectric layer containing dielectric particles therein is used as the dielectric layer.

19. The method for producing a printed wiring board according to claim 7, wherein a dielectric layer containing dielectric particles therein is used as the dielectric layer.

20. The method for producing a printed wiring board according to claim 7, wherein a dielectric layer containing dielectric particles in an amount of mass % or more and 95% or less therein is used as the dielectric layer.

* * * * *

UNITED STATES PATENT AND TRADEMARK OFFICE
CERTIFICATE OF CORRECTION

PATENT NO. : 10,342,143 B2
APPLICATION NO. : 15/773373
DATED : July 2, 2019
INVENTOR(S) : Toshiyuki Shimizu, Toshifumi Matsushima and Yoshihiro Yoneda Page 1 of 1

It is certified that error appears in the above-identified patent and that said Letters Patent is hereby corrected as shown below:

On the Title Page

"(73) Assignee: MITSUI MINNG & SMELTING
CO., LTD., Tokyo (JP)"

Should be replaced with:
--(73) Assignee: MITSUI MINING & SMELTING
CO., LTD., Tokyo (JP)--.

Signed and Sealed this
Twenty-fourth Day of March, 2020

Andrei Iancu
*Director of the United States Patent and Trademark Office*